(12) United States Patent
Chen et al.

(10) Patent No.: US 11,392,164 B2
(45) Date of Patent: Jul. 19, 2022

(54) SIGNAL RECEIVING CIRCUIT, MEMORY STORAGE DEVICE AND METHOD FOR EVALUATING STATUS OF ADJUSTMENT CIRCUIT FOR ADJUSTING INPUT SIGNAL

(71) Applicant: PHISON ELECTRONICS CORP., Miaoli (TW)

(72) Inventors: Sheng-Wen Chen, Taichung (TW); Shih-Yang Sun, Taoyuan (TW); Zhen-Hong Hung, New Taipei (TW)

(73) Assignee: PHISON ELECTRONICS CORP., Miaoli (TW)

( * ) Notice: Subject to any disclaimer, the term of this patent is extended or adjusted under 35 U.S.C. 154(b) by 275 days.

(21) Appl. No.: 16/736,819

(22) Filed: Jan. 8, 2020

(65) Prior Publication Data
US 2021/0191453 A1    Jun. 24, 2021

(30) Foreign Application Priority Data

Dec. 20, 2019   (TW) ................................ 108146919

(51) Int. Cl.
*G06F 1/10*     (2006.01)
*G06F 1/08*     (2006.01)
(Continued)

(52) U.S. Cl.
CPC ................. *G06F 1/10* (2013.01); *G06F 1/08* (2013.01); *G06F 1/12* (2013.01); *G11C 11/4074* (2013.01);
(Continued)

(58) Field of Classification Search
CPC ...... G06F 1/10; G06F 1/08; G06F 1/12; G11C 11/4074; G11C 11/4076; G11C 7/1084;
(Continued)

(56) References Cited

U.S. PATENT DOCUMENTS 6,603,706 B1 *   8/2003   Nystuen ............... G11C 7/1051
                                                         365/230.04
7,198,197 B2 *   4/2007   Best ..................... G11C 7/1006
                                                         235/492

(Continued)

FOREIGN PATENT DOCUMENTS

TW           201705710           2/2017

OTHER PUBLICATIONS

"Office Action of Taiwan Counterpart Application", dated Dec. 25, 2020, p. 1-p. 7.

*Primary Examiner* — Raymond N Phan
(74) *Attorney, Agent, or Firm* — JCIPRNET

(57) ABSTRACT

A signal receiving circuit is provided. The signal receiving circuit includes a receiving circuit, an adjustment circuit and a boundary detection circuit. The receiving circuit is configured to receive an input signal. The adjustment circuit is configured to adjust the input signal. The boundary detection circuit is configured to detect a first signal having a first data pattern in the input signal and a second signal having a second data pattern in the input signal. The boundary detection circuit is further configured to detect a gap value between a first signal boundary of the first signal and a second signal boundary of the second signal to reflect a status of the adjustment circuit.

23 Claims, 6 Drawing Sheets

(51) Int. Cl.
*H03L 7/08* (2006.01)
*G11C 11/4076* (2006.01)
*G11C 11/4074* (2006.01)
*G06F 1/12* (2006.01)

(52) U.S. Cl.
CPC ........ *G11C 11/4076* (2013.01); *H03L 7/0807* (2013.01)

(58) Field of Classification Search
CPC ........... G11C 7/222; H03L 7/08; H03L 7/093; H03L 7/1976
See application file for complete search history.

(56) References Cited

U.S. PATENT DOCUMENTS

| | | | |
|---|---|---|---|
| 10,541,757 B2* | 1/2020 | Maeda | H04B 10/255 |
| 10,965,438 B1* | 3/2021 | Sun | H04L 25/03146 |
| 2011/0185218 A1* | 7/2011 | Nygren | G11C 7/222 |
| | | | 713/503 |
| 2013/0241607 A1* | 9/2013 | Hongou | H03L 7/085 |
| | | | 327/117 |
| 2014/0325107 A1* | 10/2014 | Iwatsuki | G06F 13/4022 |
| | | | 710/124 |
| 2018/0350411 A1* | 12/2018 | Ware | G06F 1/12 |

* cited by examiner

SIGNAL RECEIVING CIRCUIT, MEMORY STORAGE DEVICE AND METHOD FOR EVALUATING STATUS OF ADJUSTMENT CIRCUIT FOR ADJUSTING INPUT SIGNAL

CROSS-REFERENCE TO RELATED APPLICATION

This application claims the priority benefit of Taiwan application serial no. 108146919, filed on Dec. 20, 2019. The entirety of the above-mentioned patent application is hereby incorporated by reference herein and made a part of this specification.

BACKGROUND

1. Technology Field

The invention relates to a signal receiving technique, and more particularly, to a signal receiving circuit, a memory storage device and a signal receiving method.

2. Description of Related Art

The markets of digital cameras, cellular phones, and MP3 players have expanded rapidly in recent years, resulting in escalated demand for storage media by consumers. The characteristics of data non-volatility, low power consumption, and compact size make a rewritable non-volatile memory module (e.g., flash memory) ideal to be built in the portable multi-media devices as cited above.

Generally, in order to overcome the channel loss during signal transmission, a receiver circuit of the signal uses an equalizer to compensate the received signal and uses a clock data recovery circuit to perform a phase lock on the signal. In addition, the receiver circuit may use algorithm as LMS to evaluate a convergence status of the equalizer. However, there is still a lack of a mechanism that can quickly analyze a quality of the signal to evaluate the convergence status of the equalizer.

SUMMARY

The invention provides a signal receiving circuit, a memory storage device and a signal receiving method that can quickly evaluate a status of the adjustment circuit for adjusting input signals at a signal receiver end.

An exemplary embodiment of the invention provides a signal receiving circuit, which includes a receiving circuit, an adjustment circuit and a boundary detection circuit. The receiving circuit is configured to receive an input signal. The adjustment circuit is coupled to the receiving circuit and configured to adjust the input signal. The boundary detection circuit is coupled to the signal receiving circuit and the receiving circuit and configured to detect a first signal having a first data pattern in the input signal and a second signal having a second data pattern in the input signal. The boundary detection circuit is further configured to detect a gap value between a first signal boundary of the first signal and a second signal boundary of the second signal to reflect a status of the adjustment circuit.

An exemplary embodiment of the invention further provides a memory storage device, which includes a connection interface unit, a rewritable non-volatile memory module, a signal receiving circuit and a memory control circuit unit. The connection interface unit is configured to couple to a host system. The signal receiving circuit is disposed at the connection interface unit. The memory control circuit unit is coupled to the connection interface unit, the rewritable non-volatile memory module and the signal receiving circuit. The signal receiving circuit is configured to receive an input signal. The signal receiving circuit is further configured to adjust the input signal through an adjustment circuit. The signal receiving circuit is configured to detect a first signal having a first data pattern in the input signal and a second signal having a second data pattern in the input signal. The signal receiving circuit is further configured to detect a gap value between a first signal boundary of the first signal and a second signal boundary of the second signal to reflect a status of the adjustment circuit.

An exemplary embodiment of the invention further provides a signal receiving method for a memory storage device. The signal receiving method includes: receiving an input signal; adjusting the input signal through an adjustment circuit; detecting a first signal having a first data pattern in the input signal and a second signal having a second data pattern in the input signal; and detecting a gap value between a first signal boundary of the first signal and a second signal boundary of the second signal to reflect a status of the adjustment circuit.

Based on the above, after the first signal having the first data pattern in the input signal and the second signal having the second data pattern in the input signal are detected, the gap value between the first signal boundary of the first signal and the second signal boundary of the second signal may then be obtained. According to this gap value, the status of the adjustment circuit for adjusting the input signal may be quickly evaluated at the signal receiver end.

To make the aforementioned more comprehensible, several embodiments accompanied with drawings are described in detail as follows.

DESCRIPTION OF THE EMBODIMENTS

Exemplary embodiments are provided below to describe the invention in detail, though the invention is not limited to the provided exemplary embodiments, and the provided exemplary embodiments can be suitably combined. The term "coupling/coupled" used in this specification (including claims) may refer to any direct or indirect connection means. For example, "a first device is coupled to a second device" should be interpreted as "the first device is directly connected to the second device" or "the first device is indirectly connected to the second device through other devices or connection means." In addition, the term "signal" can mean a current, a voltage, a charge, a temperature, data or any one or multiple signals.

Figure 1:
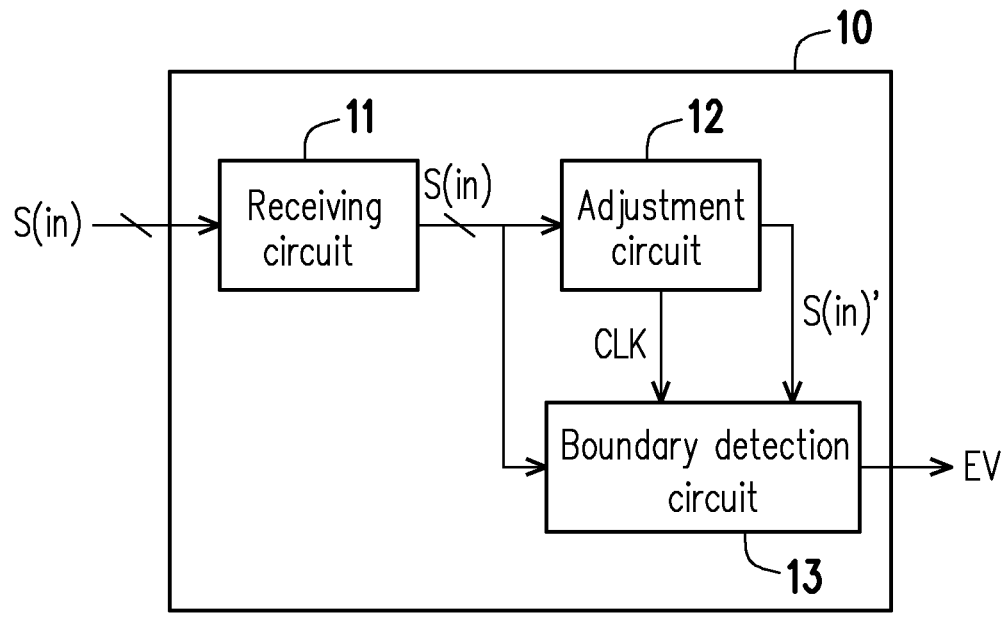
FIG. 1 is a schematic diagram illustrating a signal receiving circuit according to exemplary embodiment of the invention.

FIG. 1 is a schematic diagram illustrating a signal receiving circuit according to exemplary embodiment of the invention. Referring to FIG. 1, a signal receiving circuit 10 includes a receiving circuit 11, an adjustment circuit 12 and a boundary detection circuit 13. The receiving circuit is configured to receive a signal (a.k.a. an input signal) S(in). In an exemplary embodiment, the receiving circuit 11 is also known as a receiver front-end circuit.

The adjustment circuit 12 is coupled to the receiving circuit 11. The adjustment circuit 12 may be used to perform adjustment operations such as compensation and/or a phase lock and output a signal S(in)'. The signal S(in)' is configured to represent the signal S(in) adjusted by the adjustment circuit 12. For example, the adjustment circuit 12 may use a specific system parameter to adjust a voltage (or an amplitude) of the signal S(in) and/or a phase (or a frequency) of the signal S(in), so that the signal S(in)' may be more useful in a subsequent analysis (e.g., sampling). Further, during the process of adjusting the signal S(in), the system parameter used by the adjustment circuit 12 may be adjusted to improve a quality of the signal S(in)'.

The boundary detection circuit 13 is coupled to the receiving circuit 11 and the adjustment circuit 12. The boundary detection circuit 13 may be used to analyze the signal S(in)', so as to detect a signal (a.k.a. a first signal) having a specific data pattern (a.k.a. a first data pattern) in the signal S(in)' and a signal (a.k.a. a second signal) having another data pattern (a.k.a. a second data pattern) in the signal S(in)'. The first data pattern is different from the second data pattern. For example, the first signal may be transmitted in a specific signal channel (a.k.a. a first signal channel), and the second signal may be transmitted in another signal channel (a.k.a. a second signal channel).

In an exemplary embodiment, the first data pattern may be a waveform corresponding to a combination of consecutive first bits (e.g., "111011"), and the second data pattern may be a waveform corresponding to a combination of consecutive second bits (e.g., "001000"). The invention is not intended to limit the combination of the first bits and the combination of the second bits. For example, in another exemplary embodiment, if the combination of the first bits is "111011", the combination of the second bits may also be "000100".

After detecting the first signal having the first data pattern and the second signal having the second data pattern, the boundary detection circuit 13 may detect a gap value between a signal boundary (a.k.a. a first signal boundary) of the first signal and a signal boundary (a.k.a. a second signal boundary) of the second signal. For example, the gap value may reflect a width (or an average width) between the first signal boundary and the second signal boundary. The boundary detection circuit 13 may generate a parameter (a.k.a. an evaluation parameter) EV to reflect a status (e.g., a convergence status) of the adjustment circuit 12. The status of the adjustment circuit 12 is related to how good the system parameter currently used by the adjustment circuit 12 to adjust the signal S(in) is. If the parameter EV reflects that the status of the adjustment circuit 12 is not good (e.g., a convergence speed is lower than a threshold), the adjustment circuit 12 may correspondingly adjust the used system parameter. Further, if the parameter EV reflects that the status of the adjustment circuit 12 is very good (e.g., the convergence speed is higher than the threshold), the adjustment circuit 12 may maintain the currently used system parameter.

Figure 2:
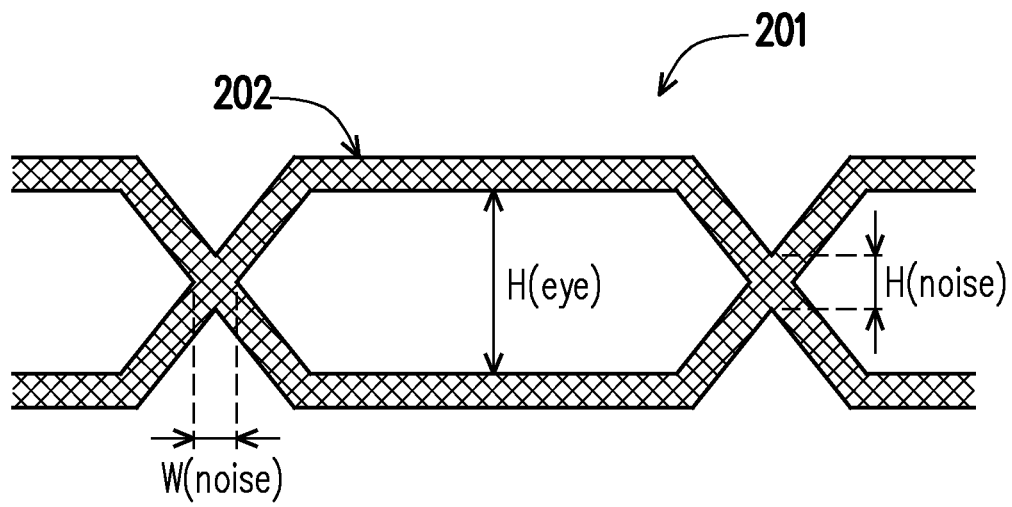
FIG. 2 is a schematic diagram illustrating a signal eye diagram according to an exemplary embodiment of the invention.

FIG. 2 is a schematic diagram illustrating a signal eye diagram according to an exemplary embodiment of the invention. Referring to FIG. 1 and FIG. 2, in an exemplary embodiment, a waveform 201 may be used to represent a part of the waveform of the signal S(in)'. The waveform 201 includes at least one eye 202. In an exemplary embodiment, the detected gap value may reflect a height H(eye) of the eye 202 in the waveform 201, a height H(noise) of noise between eyes, and/or a width W(noise) of noise between eyes.

In general, if the height H(eye) is wider, the height H(noise) is narrower and/or the width W(noise) is narrower, the quality of the signal S(in)' is better and the current convergence status of the adjustment circuit 12 is better. Conversely, if the height H(eye) is narrower, the height H(noise) is wider and/or the width W(noise) is wider, the quality of the signal S(in)' is worse and the current convergence status of the adjustment circuit 12 is worse. Therefore, in an exemplary embodiment, the system parameter used by the adjustment circuit 12 may be adjusted according to the detected gap value, so as to gradually improve the convergence status of the adjustment circuit 12.

Figure 3:
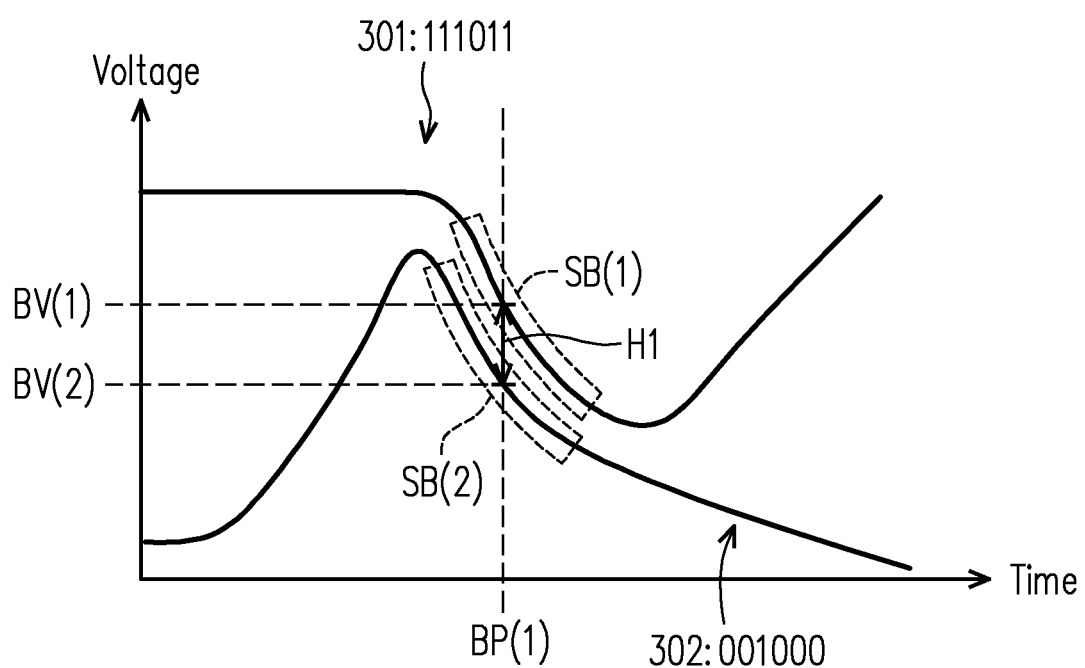
FIG. 3 is a schematic diagram illustrating a gap value between a first signal boundary and a second signal boundary according to an exemplary embodiment of the invention.

FIG. 3 is a schematic diagram illustrating a gap value between a first signal boundary and a second signal boundary according to an exemplary embodiment of the invention. It should be noted that the horizontal axis in FIG. 3 represents time and the vertical axis represents voltage.

Referring too FIG. 1 and FIG. 3, in an exemplary embodiment, it is assumed that the first data pattern is a waveform 301 corresponding to consecutive first bits "111011", and the second data pattern is a waveform 302 corresponding to consecutive second bits "001000". The waveform 301 appears in the first signal, and the waveform 302 appears in the second signal.

After detecting the waveforms 301 and 302 that overlap each other in time, the boundary detection circuit 13 may detect a difference H1 between a signal boundary SB(1) of the waveform 301 and a signal boundary SB(2) of the waveform 302. In this exemplary embodiment, the difference H1 is a voltage difference. For example, the difference H1 may be used to represent the height H(noise) in FIG. 2. Then, the boundary detection circuit 13 may obtain the gap value according to the difference H1.

In an exemplary embodiment, the boundary detection circuit 13 may detect a baseline value BV(1) of the signal boundary SB(1) on a baseline point BP(1) and detect a baseline value BV(2) of the signal boundary SB(2) on the baseline point BP(1). The baseline point BP(1) corresponds to a specific time point, and the baseline values BV(1) and BV(2) are voltage values. The boundary detection circuit 13 may determine the gap value according to the difference H1 between the baseline values BV(1) and BV(2). For example, the gap value may be identical to the difference H1. Alternatively, the boundary detection circuit 13 may perform a specific logical operation on the difference H1 to obtain the gap value.

In an exemplary embodiment, the baseline point BP(1) may be determined by the adjustment circuit 12 of FIG. 1.

For example, the baseline point BP(1) may be locked between two adjacent eyes in the waveforms of the signal S(in)'.

Figure 4:
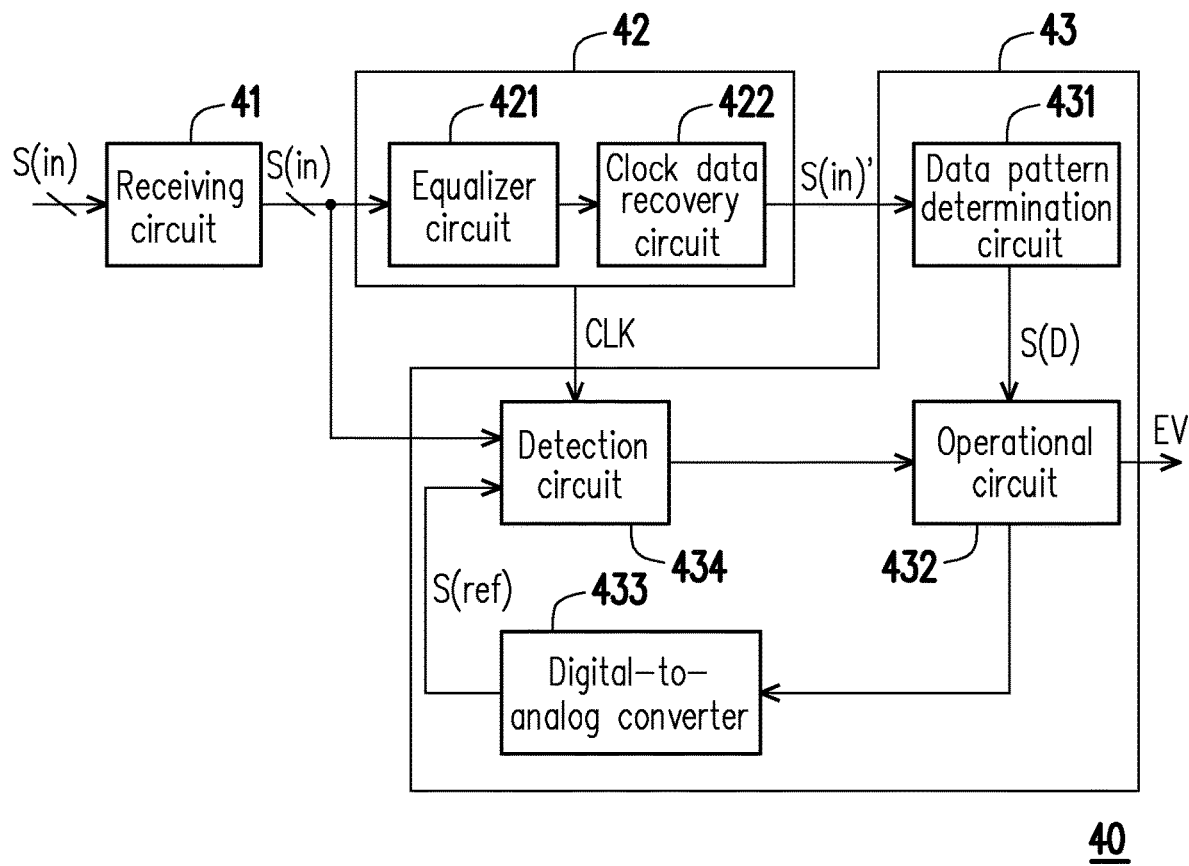
FIG. 4 is a schematic diagram illustrating a signal receiving circuit according to exemplary embodiment of the invention.

FIG. 4 is a schematic diagram illustrating a signal receiving circuit according to exemplary embodiment of the invention. Referring to FIG. 4, in an exemplary embodiment, a signal receiving circuit 40 includes a receiving circuit 41, an adjustment circuit 42 and a boundary detection circuit 43. The receiving circuit 41 is configured to receive a signal S(in). The adjustment circuit 42 may include an equalizer circuit 421 and a clock data recovery circuit 422. The equalizer circuit 421 may compensate the signal S(in). For example, the equalizer circuit 421 may include at least one of a continuous-time linear equalizer (CTLE), an infinite impulse response (IIR) circuit and a decision feedback equalizer (DFE).

The clock data recovery circuit 422 may perform a phase lock on the signal S(in). For example, the clock data recovery circuit 422 may include a phase lock loop (PLL) circuit or the like. The signal S(in) may be processed by the equalizer circuit 421 and the clock data recovery circuit 422 in order to become a signal S(in)'. The clock data recovery circuit 422 may output the signal S(in)' and a signal (a.k.a. a clock signal) CLK. It should be noted that those with persons with ordinary skill in the art should know how the equalizer circuit 421 and the clock data recovery circuit 422 respectively compensate and perform the phase lock on the signal S(in), and thus related description is omitted herein.

The boundary detection circuit 43 includes a data pattern determination circuit 431, an operational circuit 432, a digital-to-analog converter 433 and a detection circuit 434. The data pattern determination circuit 431 is coupled to the adjustment circuit 42 (e.g., the clock data recovery circuit 422) and configured to detect the first signal having the first data pattern in the signal S(in)' and the second signal having the second data pattern in the signal S(in)'. For example, the data pattern determination circuit 431 may continuously monitor the signal S(in)' to capture the waveforms 301 and 302 in FIG. 3, respectively. After detecting the first signal having the first data pattern and the second signal having the second data pattern, the data pattern determination circuit 431 may notify the operational circuit 432 by a signal S(D).

In an exemplary embodiment, in response to the signal S(D), the operational circuit 432 may instruct the digital-to-analog converter 433 to adjust a signal (a.k.a. a reference signal) S(ref). The signal S(ref) carries a voltage (a.k.a. a reference voltage). The operational circuit 432 may obtain a baseline value (a.k.a. a first baseline value) on the first signal boundary and a baseline value (a.k.a. a second baseline value) on the second signal boundary by adjusting the signal S(ref) (i.e., the reference voltage). In addition, the detection circuit 434 may compare the signal S(in) with the signal S(ref) according to the signal CLK. For example, the detection circuit 434 may include at least one comparator. The operational circuit 432 may obtain the gap value according to a difference between the first baseline value and the second baseline value and correspondingly generate the parameter EV.

Taking FIG. 3 as an example, if the detection circuit 434 determines that the current reference voltage is not equal to the baseline value BV(1) when measuring the baseline value BV(1), the operational circuit 432 may instruct the digital-to-analog converter 433 to adjust the signal S(ref) so as to increase or decrease the reference signal. After adjusting the reference signal, if the detection circuit 434 determines that the current reference voltage is equal to the baseline value BV(1), the detection circuit 434 may determine the current reference voltage as the baseline value BV(1). Similarly, if the detection circuit 434 determines that the current reference voltage is not equal to the baseline value BV(2) when measuring the baseline value BV(2), the operational circuit 432 may instruct the digital-to-analog converter 433 to adjust the signal S(ref) so as to increase or decrease the reference signal. After adjusting the reference signal, if the detection circuit 434 determines that the current reference voltage is equal to the baseline value BV(2), the detection circuit 434 may determine the current reference voltage as the baseline value BV(2). In this way, even if the voltage value of the signal boundary SB(1) on the baseline point BP(1) and/or the voltage value of the signal boundary SB(2) on the baseline point BP(1) are not actually measured, the detection circuit 434 can still obtain the baseline values BV(1) and BV(2). The operational circuit 432 may obtain the difference H1 according to the baseline values BV(1) and BV(2) and obtain the gap value according to the difference H1. Then, the operational circuit 432 may generate the parameter EV according to the gap value, so as to reflect a status of the adjustment circuit 42.

In an exemplary embodiment, the clock data recovery circuit 422 may determine a sampling point corresponding to the baseline point BP(1) by performing the phase lock on the signal S(in). The baseline point BP(1) may be used as the sampling point to measure the baseline values BV(1) and BV(2).

It should be noted that, in the exemplary embodiments of FIG. 3 and FIG. 4, the height H(noise) in FIG. 2 is measured as an example. However, in another exemplary embodiment, the status of the adjustment circuit may also be evaluated by measuring the width W(noise) in FIG. 2.

Figure 5:
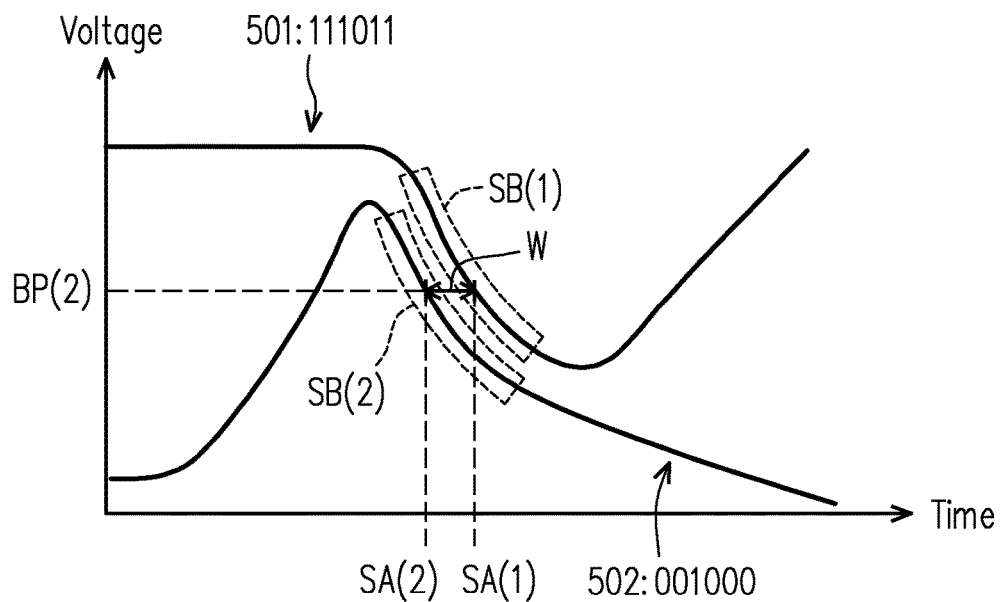
FIG. 5 is a schematic diagram illustrating a gap value between a first signal boundary and a second signal boundary according to an exemplary embodiment of the invention.

FIG. 5 is a schematic diagram illustrating a gap value between a first signal boundary and a second signal boundary according to an exemplary embodiment of the invention. It should be noted that the horizontal axis in FIG. 5 represents time and the vertical axis represents voltage.

Referring too FIG. 1 and FIG. 5, in an exemplary embodiment, it is assumed that the first data pattern is a waveform 501 corresponding to consecutive first bits "111011", and the second data pattern is a waveform 502 corresponding to consecutive second bits "001000". The waveform 501 appears in the first signal, and the waveform 502 appears in the second signal.

After detecting the waveforms 501 and 502 that overlap each other in time, the boundary detection circuit 13 may detect a difference W between a signal boundary SB(1) of the waveform 501 and a signal boundary SB(2) of the waveform 502. In this exemplary embodiment, the difference W is a time difference. For example, the difference W may be used to represent the width W(noise) in FIG. 2. Then, the boundary detection circuit 13 may obtain the gap value according to the difference W.

In an exemplary embodiment, the boundary detection circuit 13 may detect a baseline value SA(1) of the signal boundary SB(2) on a baseline point BP(2) and detect a baseline value SA(2) of the signal boundary SB(2) on the baseline point BP(2). The baseline point BP(2) corresponds to a specific voltage value, and the baseline values BV(1) and BV(2) are time points. The boundary detection circuit 13 may determine the gap value according to a difference H between the baseline values SA(1) and SA(2). For example, the gap value may be identical to the difference W. Alternatively, the boundary detection circuit 13 may perform a specific logical operation on the difference W to obtain the gap value.

In an exemplary embodiment, the baseline value SA(1) and SA(2) may be obtained by adjusting the signal CLK provided by adjustment circuit 12 of FIG. 1. For example, the sampling point of the signal CLK may be moved rightward between the baseline values SA(1) and SA(2) and the voltage value of the signal boundary SB(1) at different time points is continuously compared with the voltage value of the baseline point BP(2), so as to search for a transition point (a.k.a. a first transition point) of the signal boundary SB(1). In this exemplary embodiment, when the sampling point crosses rightward over the baseline value SA(1), the voltage value of the signal boundary SB(1) changes from the voltage value originally greater than the voltage value of the baseline point BP(2) to the voltage value less than the voltage value of the baseline point BP(2). Therefore, a time point of the first transition point may be recorded as the baseline value SA(1).

Similarly, the sampling point of the signal CLK may be moved leftward between the baseline values SA(1) and SA(2) and the voltage value of the signal boundary SB(2) at different time points is continuously compared with the voltage value of the baseline point BP(2), so as to search for a transition point (a.k.a. a second transition point) of the signal boundary SB(2). In this exemplary embodiment, when the sampling point crosses leftward over the baseline value SA(2), the voltage value of the signal boundary SB(2) changes from the voltage value originally less than the voltage value of the baseline point BP(2) to the voltage value greater than the voltage value of the baseline point BP(2). Therefore, a time point of the second transition point may be recorded as the baseline value SA(2).

Figure 6:
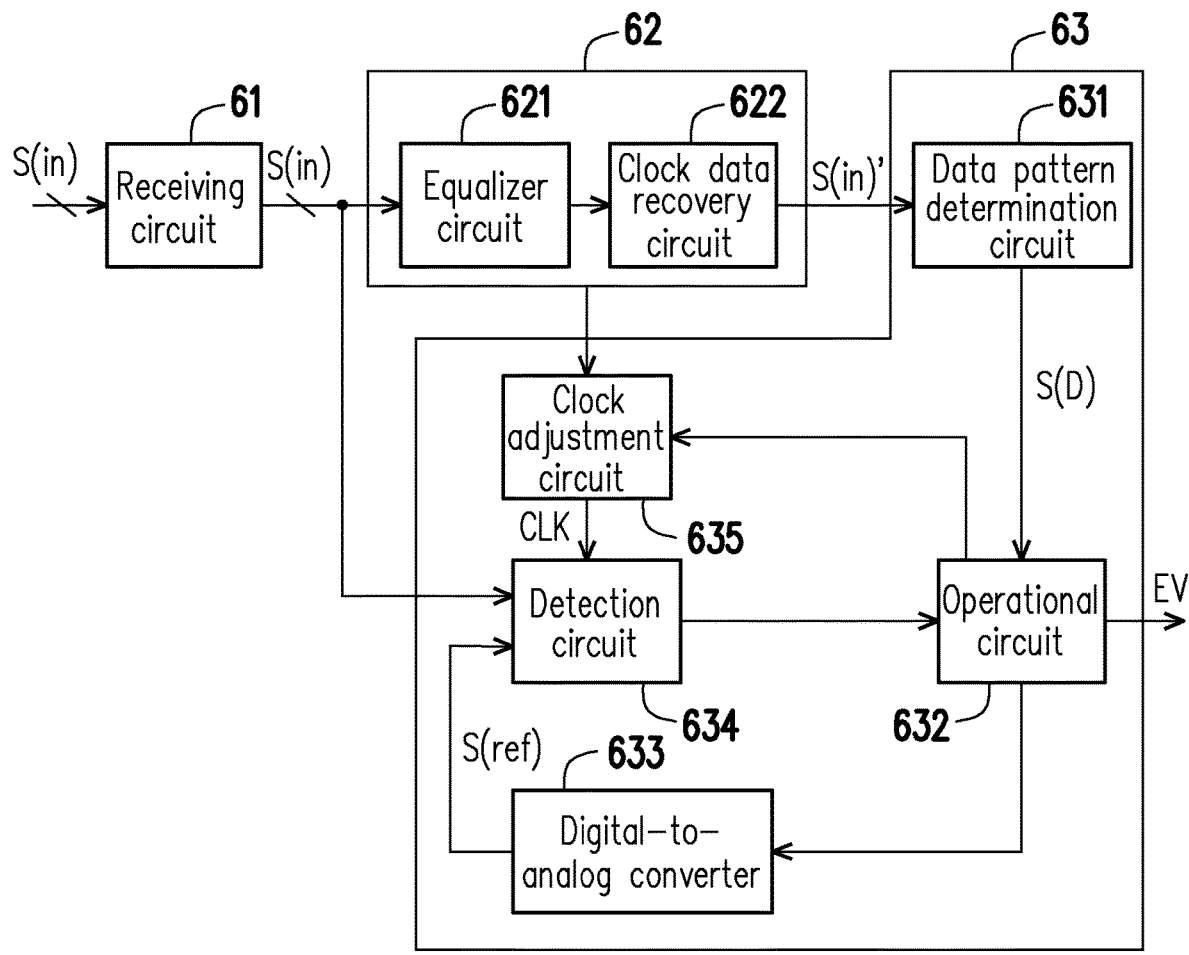
FIG. 6 is a schematic diagram illustrating a signal receiving circuit according to exemplary embodiment of the invention.

FIG. 6 is a schematic diagram illustrating a signal receiving circuit according to exemplary embodiment of the invention. Referring to FIG. 6, in an exemplary embodiment, a signal receiving circuit 60 includes a receiving circuit 61, an adjustment circuit 62 and a boundary detection circuit 63. The receiving circuit 61 is configured to receive a signal S(in). The adjustment circuit 62 may include an equalizer circuit 621 and a clock data recovery circuit 622. The equalizer circuit 621 may compensate the signal S(in). The clock data recovery circuit 622 may perform a phase lock on the signal S(in). The signal S(in) may be processed by the equalizer circuit 621 and the clock data recovery circuit 622 in order to become a signal S(in)'. The clock data recovery circuit 422 may output the signal S(in)' and a signal (a.k.a. a clock signal) CLK. It should be noted that those with persons with ordinary skill in the art should know how the equalizer circuit 621 and the clock data recovery circuit 622 respectively compensate and perform the phase lock on the signal S(in), and thus related description is omitted herein.

The boundary detection circuit 63 includes a data pattern determination circuit 631, an operational circuit 632, a digital-to-analog converter 633, a detection circuit 634 and a clock adjustment circuit 635. The data pattern determination circuit 631 is configured to detect the first signal having the first data pattern in the signal S(in)' and the second signal having the second data pattern in the signal S(in)'. For example, the data pattern determination circuit 631 may continuously monitor the signal S(in)' to capture the waveforms 501 and 502 in FIG. 5, respectively. After detecting the first signal having the first data pattern and the second signal having the second data pattern, the data pattern determination circuit 631 may notify the operational circuit 632 by a signal S(D).

In an exemplary embodiment, in response to the signal S(D), the operational circuit 632 may instruct the clock adjustment circuit 635 to adjust a phase of the signal CLK. The detection circuit 634 may use the adjusted signal CLK to sample the first signal boundary and the second signal boundary respectively, so as to obtain the first transition point of the first signal boundary and the second transition point of the second signal boundary. The detection circuit 634 may determine the first baseline value and the second baseline value respectively according to the first transition point and the second transition point. Next, the operational circuit 632 may obtain the gap value according to a difference between the first baseline value and the second baseline value and correspondingly generate the parameter EV. In addition, the digital-to-analog converter 633 is configured to provide the signal S(ref) as the reference voltage.

Taking FIG. 5 as an example, the voltage value of the baseline point BP(2) may be set according to the signal S(ref). For example, the voltage value of the baseline point BP(2) may be equal to the reference voltage provided by the signal S(ref). When searching for the first transition point, the sampling point of the signal CLK may be moved rightward between the baseline values SA(1) and SA(2). The detection circuit 634 may continuously compare the voltage value of the signal boundary SB(1) at different time points with the voltage value of the baseline point BP(2). For example, when the sampling point crosses rightward over the baseline value SA(1), the voltage value of the signal boundary SB(1) changes from the voltage value originally greater than the voltage value of the baseline point BP(2) to the voltage value less than the voltage value of the baseline point BP(2). Accordingly, the detection circuit 634 may determine that the baseline value SA(1) is the first transition point and determine the baseline value SA(1) as the first baseline value.

Similarly, when searching for the second transition point, the sampling point of the signal CLK may be moved leftward between the baseline values SA(1) and SA(2). The detection circuit 634 may continuously compare the voltage value of the signal boundary SB(2) at different time points with the voltage value of the baseline point BP(2). For example, when the sampling point crosses leftward over the baseline value SA(2), the voltage value of the signal boundary SB(2) changes from the voltage value originally less than the voltage value of the baseline point BP(2) to the voltage value greater than the voltage value of the baseline point BP(2). Accordingly, the detection circuit 634 may determine that the baseline value SA(2) is the second transition point and determine the baseline value SA(2) as the second baseline value. The operational circuit 632 may obtain the difference W according to the baseline values SA(1) and SA(2) and obtain the gap value according to the difference W. Then, the operational circuit 632 may generate the parameter EV according to the gap value, so as to reflect a status of the adjustment circuit 62.

Figure 7:
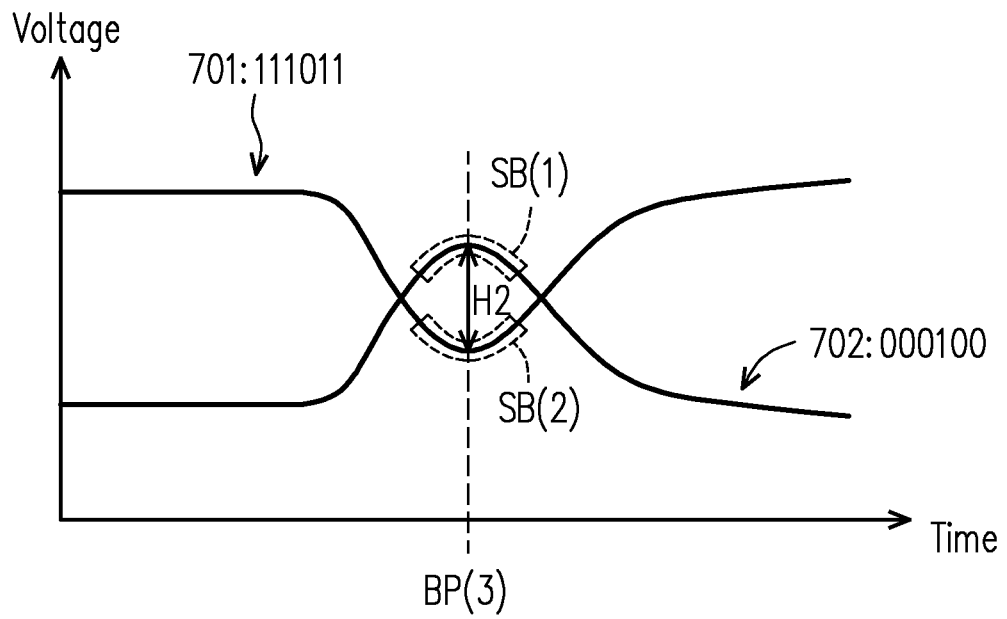
FIG. 7 is a schematic diagram illustrating a gap value between a first signal boundary and a second signal boundary according to an exemplary embodiment of the invention.

It should be noted that in an exemplary embodiment, the status of the adjustment circuit may also evaluated by measuring the height H(eye) in FIG. 2. FIG. 7 is a schematic diagram illustrating a gap value between a first signal boundary and a second signal boundary according to an exemplary embodiment of the invention. It should be noted that the horizontal axis in FIG. 7 represents time and the vertical axis represents voltage.

Referring too FIG. 1 and FIG. 7, in an exemplary embodiment, it is assumed that the first data pattern is a waveform 701 corresponding to consecutive first bits "111011", and the second data pattern is a waveform 702 corresponding to consecutive second bits "000100". The waveform 701 appears in the first signal, and the waveform 702 appears in the second signal.

After detecting the waveforms 701 and 702 that overlap each other in time, the boundary detection circuit 13 may detect a difference H2 between a signal boundary SB(1) of the waveform 701 and a signal boundary SB(2) of the waveform 702 on a baseline point BP(3). In an exemplary embodiment, the baseline point BP(3) is a specific time point and the difference H2 is a voltage difference. For example, the baseline point BP(3) may be determined by the adjustment circuit 12. For example, the baseline point BP(3) may be locked at a center position of one eye in the waveforms of the signal S(in)'. For example, the difference H2 may be used to represent the height H(eye) in FIG. 2. hen, the boundary detection circuit 13 may obtain the gap value according to the difference H2. It should be noted that, for the operation of obtaining the difference H2 and determining the gap value according to the difference H2 in the exemplary embodiment of FIG. 7, reference may be made to the description of the exemplary embodiments of FIG. 3 and FIG. 4, which are not repeated hereinafter.

In an exemplary embodiment, the parameter EV may be obtained by performing at least one logical operation (e.g., the logical operation described above) on the gap value. In an exemplary embodiment, the parameter EV may be directly used as a replacement of the gap value without additionally generating the parameter EV.

In an exemplary embodiment, the boundary detection circuits 13, 43, and/or 63 may further perform one or more operations according to the gap value to improve a signal quality of the signal S(in) and/or improve a processing capability for the signal S(in). Taking FIG. 4 as an example, the boundary detection circuit 43 may adjust a setting parameter of the equalizer circuit 421 and/or the clock data recovery circuit 422 according to the gap value, request a transmitter of the signal S(in) to adjust a quality of the signal S(in) (e.g., request the transmitter to adjust electrical parameters of the signal S(in) including the phase, the frequency, and/or the amplitude), and/or instruct the adjustment circuit 421 to use one of a plurality of preset parameters. In this way, a signal reception and/or the processing capacity of the signal receiving circuits 10, 40 and/or 60 may be improved according to the measured gap value.

In an exemplary embodiment, the signal receiving circuit 10 of FIG. 1, the signal receiving circuit 40 of FIG. 4 and/or the signal receiving circuit 60 of FIG. 6 may be disposed in a memory storage device. In another exemplary embodiment, the signal receiving circuit 10 of FIG. 1, the signal receiving circuit 40 of FIG. 4 and/or the signal receiving circuit 60 of FIG. 6 may also be disposed in other types of electronic devices, and is not limited to the memory storage device.

Figure 8:
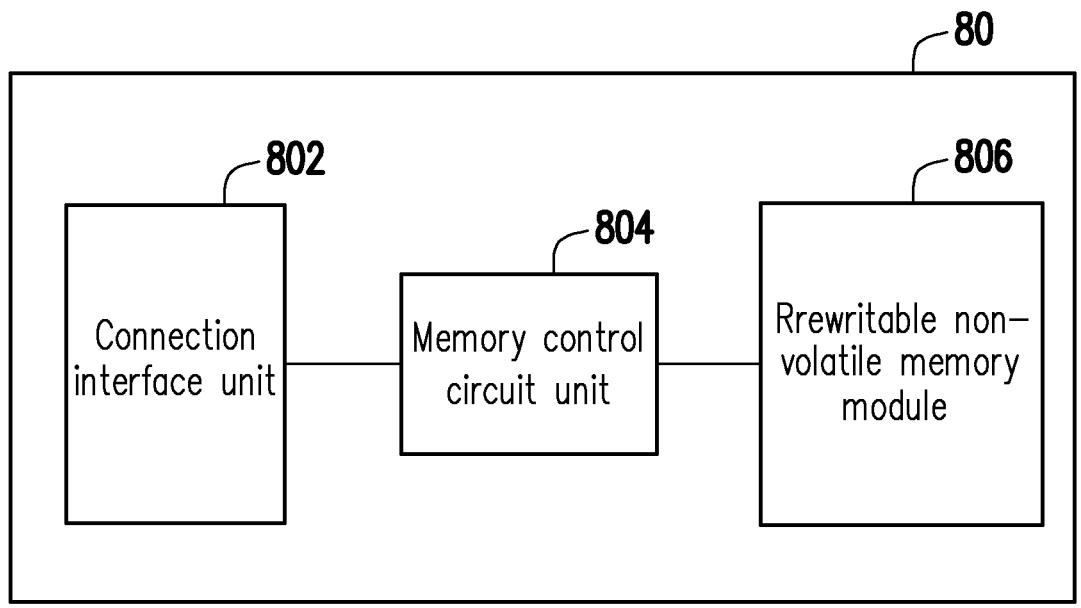
FIG. 8 is a schematic diagram illustrating a memory storage device according to an exemplary embodiment of the invention.

FIG. 8 is a schematic diagram illustrating a memory storage device according to an exemplary embodiment of the invention. Referring to FIG. 8, a memory storage device 80 is a memory storage device including a rewritable non-volatile memory module 806, such as a SSD (Solid State Drive). The memory storage device 80 may be used together with a host system so the host system may write data into the memory storage device 80 or read data from the memory storage device 80. For example, the mentioned host system may be any system capable of substantially cooperating with the memory storage device 80 for storing data, such as a desktop computer, a notebook computer, a digital camera, a video camera, a communication device, an audio player, a video player or a tablet computer.

The memory storage device 80 includes a connection interface unit 801, a memory control circuit unit 804 and a rewritable non-volatile memory module 806. The connection interface unit 801 is configured to connect the memory storage device 80 to the host system. In an exemplary embodiment, the connection interface unit 801 is compatible with a SATA (Serial Advanced Technology Attachment) standard. Nevertheless, it should be understood that the invention is not limited in this regard. The connection interface unit 801 may also be compatible with a PATA (Parallel Advanced Technology Attachment) standard, a PCI Express (Peripheral Component Interconnect Express) interface standard, a USB (Universal Serial Bus) standard or other suitable standards. The connection interface unit 801 may be packaged into one chip with the memory control circuit unit 804, or the connection interface unit 801 may also be distributed outside of a chip containing the memory control circuit unit 804.

The memory control circuit unit 804 is configured to perform operations of writing, reading or erasing data in the rewritable non-volatile memory module 806 according to the control commands. In an exemplary embodiment, the memory control circuit unit 804 is also known as a memory controller or a flash memory controller.

The rewritable non-volatile memory module 806 is coupled to the memory control circuit unit 804 and configured to store data written from the host system. The rewritable non-volatile memory module 806 may be a SLC (Single Level Cell) NAND flash memory module (i.e., a flash memory module capable of storing one bit in one memory cell), an MLC (Multi Level Cell) NAND flash memory module (i.e., a flash memory module capable of storing two bits in one memory cell), a TLC (Triple Level Cell) NAND flash memory module (i.e., a flash memory module capable of storing three bits in one memory cell), a QLC (Qual Level Cell) NAND-type flash memory module (i.e., a flash memory module capable of storing four bits in one memory cell), other flash memory modules or other memory modules having the same features.

In an exemplary embodiment, the signal receiving circuit 10 of FIG. 1, the signal receiving circuit 40 of FIG. 4 and/or the signal receiving circuit 60 of FIG. 6 may be disposed in the connection interface unit 801, the memory control circuit unit 804 and/or the rewritable non-volatile memory module 806 of FIG. 8. In another exemplary embodiment, if the signal receiving circuit 10 of FIG. 1, the signal receiving circuit 40 of FIG. 4 and/or the signal receiving circuit 60 of FIG. 6 are disposed in the connection interface unit 801, the signal S(in) may be a signal form the host system (e.g., a data signal or any signal).

It should be noted that, electronic circuit structures illustrated in FIG. 1, FIG. 4 and FIG. 6 are schematic drawings of the signal receiving circuit in some of the exemplary embodiments instead of limitations to the disclosure. In certain non-mentioned applications, more electronic components may be added to the signal receiving circuit or used to replace some existing electronic components to provide additional, identical or similar functionality. Moreover, in certain non-mentioned applications, a circuit layout and/or a coupling relation between elements inside the signal receiving circuit may also be properly altered to meet practical requirements.

Figure 9:
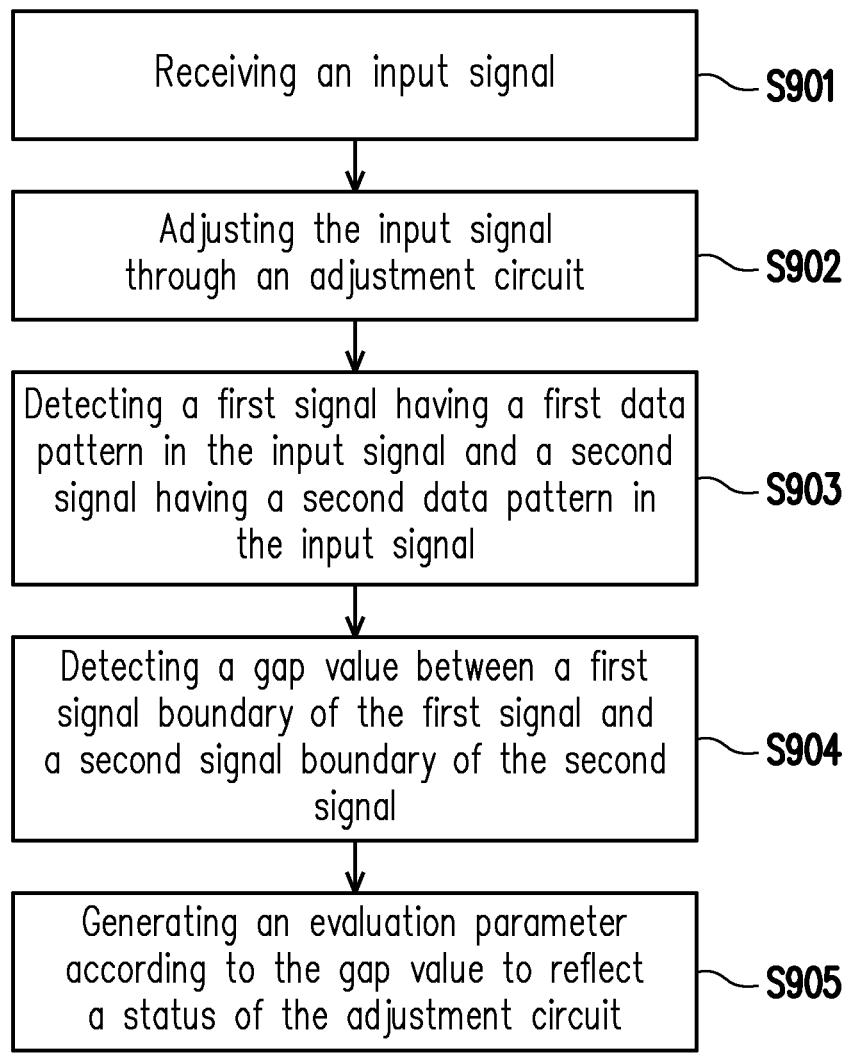
FIG. 9 is a flowchart illustrating a signal generation method according to an exemplary embodiment of the invention.

FIG. 9 is a flowchart illustrating a signal generation method according to an exemplary embodiment of the invention. Referring to FIG. 9, in step S901, an input signal is received. In step S902, the input signal is adjusted through an adjustment circuit. In step S903, a first signal having a first data pattern in the input signal and a second signal having a second data pattern in the input signal are detected. In step S904, a gap value between a first signal boundary of the first signal and a second signal boundary of the second signal is detected. In step S905, an evaluation parameter is generated according to the gap value to reflect a status of the adjustment circuit.

Nevertheless, steps depicted in FIG. 9 are described in detail as above so that related description thereof is omitted hereinafter. It should be noted that, the steps depicted in FIG. 9 may be implemented as a plurality of program codes or circuits, which are not particularly limited in the invention. Moreover, the method disclosed in FIG. 9 may be implemented by reference with above exemplary embodiments, or may be implemented separately, which are not particularly limited in the invention.

In summary, as proposed in the exemplary embodiments of the invention, the first signal having the first data pattern in the input signal and the second signal having the data pattern in the input signal are detected. Next, the gap value between the first signal boundary of the first signal and the second signal boundary of the second signal may be obtained. Then, one evaluation parameter may be generated according to the gap value. According to this evaluation parameter, the status of the adjustment circuit for adjusting the input signal may be quickly evaluated at the signal receiver end.

Although the present disclosure has been described with reference to the above embodiments, it will be apparent to one of ordinary skill in the art that modifications to the described embodiments may be made without departing from the spirit of the disclosure. Accordingly, the scope of the disclosure will be defined by the attached claims and not by the above detailed descriptions.

What is claimed is:

1. A signal receiving circuit, comprising:
a receiving circuit, configured to receive an input signal;
an adjustment circuit, coupled to the receiving circuit and configured to adjust the input signal; and
a boundary detection circuit, coupled to the receiving circuit and the adjustment circuit and configured to detect a first signal having a first data pattern in the input signal and a second signal having a second data pattern in the input signal,
wherein the boundary detection circuit is further configured to detect a gap value between a first signal boundary of the first signal and a second signal boundary of the second signal to reflect a status of the adjustment circuit.

2. The signal receiving circuit according to claim 1, wherein the boundary detection circuit comprises:
a detection circuit, configured to detect a first baseline value of the first signal boundary on a baseline point and detect a second baseline value of the second signal boundary on the baseline point; and
an operational circuit, coupled to the detection circuit and configured to obtain the gap value according to a difference between the first baseline value and the second baseline value.

3. The signal receiving circuit according to claim 1, wherein the boundary detection circuit further comprises:
a data pattern determination circuit, coupled to the adjustment circuit and configured to detect the first signal having the first data pattern in the input signal and the second signal having the second data pattern in the input signal.

4. The signal receiving circuit according to claim 1, wherein the adjustment circuit comprises:
an equalizer circuit, coupled to the receiving circuit and the boundary detection circuit and configured to compensate the input signal.

5. The signal receiving circuit according to claim 1, wherein the boundary detection circuit is further configured to perform, according to the gap value, at least one of a plurality of operations of:
adjusting a setting parameter of the adjustment circuit;
requesting a transmitter of the input signal to adjust a quality of the input signal; and
instructing the adjustment circuit to use one of a plurality of preset parameters.

6. The signal receiving circuit according to claim 2, wherein the adjustment circuit comprises:
a clock data recovery circuit, coupled to the receiving circuit, the adjustment circuit and the detection circuit,
wherein the clock data recovery circuit is configured to perform a phase lock on the input signal and determine a sampling point corresponding to the baseline point.

7. The signal receiving circuit according to claim 2, wherein the boundary detection circuit further comprises:
a digital-to-analog converter coupled to the detection circuit and the operational circuit,
wherein the operational circuit is further configured to instruct the digital-to-analog converter to adjust a reference voltage,
the detection circuit is further configured to determine the reference voltage as the first baseline value if the reference voltage is equal to a voltage value of the first signal boundary on the baseline point, and
the detection circuit is further configured to determine the reference voltage as the second baseline value if the reference voltage is equal to a voltage value of the second signal boundary on the baseline point.

8. The signal receiving circuit according to claim 2, wherein the boundary detection circuit further comprises:
a clock adjustment circuit, coupled to the detection circuit and the operational circuit,
wherein the operational circuit is further configured to instruct the clock adjustment circuit to adjust a phase of a clock signal,
the detection circuit is further configured to use the adjusted clock signal to sample the first signal boundary and the second signal boundary respectively, so as to obtain a first transition point of the first signal boundary and a second transition point of the second signal boundary, and
the detection circuit determines the first baseline value and the second baseline value respectively according to the first transition point and the second transition point.

9. A memory storage device, comprising:
a connection interface unit, configured to couple to a host system;
a rewritable non-volatile memory module;
a signal receiving circuit, disposed at the connection interface unit; and
a memory control circuit unit, coupled to the connection interface unit, the rewritable non-volatile memory module and the signal receiving circuit,
wherein the receiving circuit is configured to receive an input signal,
the signal receiving circuit is further configured to adjust the input signal through an adjustment circuit, the signal receiving circuit is further configured to detect a first signal having a first data pattern in the input signal and a second signal having a second data pattern in the input signal, and the signal receiving circuit is further configured to detect a gap value between a first signal boundary of the first signal and a second signal boundary of the second signal to reflect a status of the adjustment circuit.

10. The memory storage device according to claim 9, wherein the signal receiving circuit comprises a boundary detection circuit, the boundary detection circuit is configured to detect a first baseline value of the first signal boundary on a baseline point and detect a second baseline value of the second signal boundary on the baseline point, and the boundary detection circuit is further configured to obtain the gap value according to a difference between the first baseline value and the second baseline value.

11. The memory storage device according to claim 9, wherein the signal receiving circuit comprises:

a data pattern determination circuit, coupled to the adjustment circuit and configured to detect the first signal having the first data pattern in the input signal and the second signal having the second data pattern in the input signal.

12. The memory storage device according to claim 9, wherein the adjustment circuit comprises:

an equalizer circuit, configured to compensate the input signal.

13. The memory storage device according to claim 9, wherein the signal receiving circuit is further configured to perform, according to the gap value, at least one of a plurality of operations of:

adjusting a setting parameter of the adjustment circuit;
requesting a transmitter of the input signal to adjust a quality of the input signal; and
instructing the adjustment circuit to use one of a plurality of preset parameters.

14. The memory storage device according to claim 10, wherein the adjustment circuit comprises:

a clock data recovery circuit, configured to perform a phase lock on the input signal and determine a sampling point corresponding to the baseline point.

15. The memory storage device according to claim 10, wherein the boundary detection circuit is further configured to adjust a reference voltage, the boundary detection circuit is further configured to determine the reference voltage as the first baseline value if the reference voltage is equal to a voltage value of the first signal boundary on the baseline point, and the boundary detection circuit is further configured to determine the reference voltage as the second baseline value if the reference voltage is equal to a voltage value of the second signal boundary on the baseline point.

16. The memory storage device according to claim 10, wherein the boundary detection circuit is further configured to instruct the clock adjustment circuit to adjust a phase of a clock signal, the boundary detection circuit is further configured to use the adjusted clock signal to sample the first signal boundary and the second signal boundary respectively, so as to obtain a first transition point of the first signal boundary and a second transition point of the second signal boundary, and the boundary detection circuit is further configured to determine the first baseline value and the second baseline value respectively according to the first transition point and the second transition point.

17. A signal receiving method for a memory storage device, the signal receiving method comprising:

receiving an input signal;
adjusting the input signal through an adjustment circuit;
detecting a first signal having a first data pattern in the input signal and a second signal having a second data pattern in the input signal; and
detecting a gap value between a first signal boundary of the first signal and a second signal boundary of the second signal to reflect a status of the adjustment circuit.

18. The signal receiving method according to claim 17, wherein the step of detecting the gap value between the first signal boundary of the first signal and the second signal boundary of the second signal comprises:

detecting a first baseline value of the first signal boundary on a baseline point and detecting a second baseline value of the second signal boundary on the baseline point; and obtaining the gap value according to a difference between the first baseline value and the second baseline value.

19. The signal receiving method according to claim 17, wherein the step of adjusting the input signal through the adjustment circuit comprises:

compensating the input signal by an equalizer circuit.

20. The signal receiving method according to claim 17, further comprising performing, according to the gap value, at least one of a plurality of operations of:

adjusting a setting parameter of the adjustment circuit;
requesting a transmitter of the input signal to adjust a quality of the input signal; and
instructing the adjustment circuit to use one of a plurality of preset parameters.

21. The signal receiving method according to claim 18, wherein the step of adjusting the input signal through the adjustment circuit comprises:

performing a phase lock on the input signal and determining a sampling point corresponding to the baseline point through a clock data recovery circuit.

22. The signal receiving method according to claim 18, wherein the step of detecting the first baseline value of the first signal boundary on the baseline point and detecting the second baseline value of the second signal boundary on the baseline point comprises:

adjusting a reference voltage;
determining the reference voltage as the first baseline value if the reference voltage is equal to a voltage value of the first signal boundary on the baseline point; and
determining the reference voltage as the second baseline value if the reference voltage is equal to a voltage value of the second signal boundary on the baseline point.

23. The signal receiving method according to claim 18, wherein the step of detecting the first baseline value of the first signal boundary on the baseline point and detecting the second baseline value of the second signal boundary on the baseline point comprises:

adjusting a phase of a clock signal;
using the adjusted clock signal to sample the first signal boundary and the second signal boundary respectively, so as to obtain a first transition point of the first signal boundary and a second transition point of the second signal boundary; and determining the first baseline value and the second baseline value respectively according to the first transition point and the second transition point.

\* \* \* \* \*